(12) United States Patent
DeBrosse

(10) Patent No.: US 9,786,343 B1
(45) Date of Patent: Oct. 10, 2017

(54) STT MRAM COMMON SOURCE LINE ARRAY BIAS SCHEME

(71) Applicant: International Business Machines Corporation, Armonk, NY (US)

(72) Inventor: John K. DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/251,518

(22) Filed: Aug. 30, 2016

(51) Int. Cl.
 G11C 11/00 (2006.01)
 G11C 11/16 (2006.01)

(52) U.S. Cl.
 CPC ...... G11C 11/1675 (2013.01); G11C 11/1657 (2013.01); G11C 11/1673 (2013.01)

(58) Field of Classification Search
 CPC ............ G11C 11/1675; G11C 11/1673; G11C 11/1657
 USPC ......................................... 365/158, 148, 130
 See application file for complete search history.

(56) References Cited

U.S. PATENT DOCUMENTS

| | | | |
|---|---|---|---|
| 5,715,194 A | 2/1998 | Hu | |
| 6,600,690 B1 | 7/2003 | Nahas et al. | |
| 6,894,923 B2* | 5/2005 | Inaba | G11C 11/16 365/158 |
| 8,004,880 B2* | 8/2011 | Yoon | G11C 7/02 365/148 |
| 8,004,881 B2* | 8/2011 | Zhu | G11C 11/16 365/148 |
| 8,432,727 B2 | 4/2013 | Ryu et al. | |
| 8,482,966 B2* | 7/2013 | Kang | G01R 33/098 257/421 |
| 8,553,449 B2* | 10/2013 | Liu | G11C 11/16 365/158 |
| 9,036,406 B2* | 5/2015 | Kim | G11C 11/1675 365/130 |
| 9,196,339 B2 | 11/2015 | Dong | |
| 9,196,342 B2* | 11/2015 | Alam | G11C 11/165 |
| 9,349,459 B2 | 5/2016 | Sakui | |
| 9,431,083 B2* | 8/2016 | Pyo | G11O 5/06 |

(Continued)

OTHER PUBLICATIONS

DeBrosse et al., "A Fully-Functional 90nm 8Mb STT MRAM Demonstrator Featuring Trimmed, Reference Cell-Based Sensing," 2015 IEEE Custom Integrated Circuits Conference (CICC) (Sep. 2015) (3 total pages).

(Continued)

Primary Examiner — Viet Q Nguyen
(74) Attorney, Agent, or Firm — Vazken Alexanian; Michael J. Chang, LLC

(57) ABSTRACT

Improved STT MRAM CSL array bias schemes are provided. In one aspect, a method for operating a CSL STT MRAM array includes: providing the STT MRAM array having a plurality of word lines perpendicular to both a plurality of bit lines and at least one source line; a plurality of memory cells including magnetic tunnel junctions in series with field effect transistors, wherein the field effect transistors are gated by the word lines, wherein the bit lines are connected to the magnetic tunnel junctions, and wherein the source line is connected to the field effect transistors; and applying a first word line voltage (Vdd) to a selected one of the word lines during a read, and a different second word line voltage (Vpp) to the selected word line during a write.

20 Claims, 7 Drawing Sheets

(56) References Cited

U.S. PATENT DOCUMENTS

| | | | |
|---|---|---|---|
| 2008/0219043 A1* | 9/2008 | Yoon | G11C 11/16 365/158 |
| 2014/0063922 A1* | 3/2014 | Kim | G11C 8/08 365/158 |
| 2016/0148683 A1 | 5/2016 | Yoon et al. | |

OTHER PUBLICATIONS

C. Kim et al., "A covalent-bonded cross-coupled current-mode sense amplifier for STT-MRAM with 1t1mtj common source-line structure array," International Solid-State Circuits Conference, ISSCC, Feb. 2015, 7.4, 3 pages.

S. Chatterjee et al., "Dual-source-line-bias scheme to improve the read margin and sensing accuracy of STTRAM in sub-90-nm nodes," IEEE Transactions on Circuits and Systems II: Express Briefs, vol. 57, No. 3, Mar. 2010, pp. 208-212.

List of IBM Patents or Applications Treated as Related.

\* cited by examiner

|  | Word Line WL | | Bit Line BL | | Source Line SL |
| --- | --- | --- | --- | --- | --- |
|  | Selected | Unselected | Selected | Unselected | |
| Standby | 0 | 0 | 0 | 0 | 0 |
| Read | Vpp* | 0 | Vread | 0 | 0 |
| Write0 | Vpp* | 0 | Vwr0 | 0 | 0 |
| Write1 | Vpp* | 0 | 0 | Vwr1 | Vwr1 |

*Vpp = Vgs_max

FIG. 1

|  | Word Line WL | | Bit Line BL | | Source Line SL |
| --- | --- | --- | --- | --- | --- |
|  | Selected | Unselected | Selected | Unselected | |
| Standby | 0 | 0 | 0 | 0 | 0 |
| Read | Vdd | 0 | Vread | 0 | 0 |
| Write0 | Vpp* | 0 | Vwr0 | Vsl0 | Vsl0 |
| Write1 | Vpp* | 0 | 0 | Vwr1 | Vwr1 |

*Vpp = min (Vsl0, Vmtj_wr1) + Vgs_max

FIG. 2

STT MRAM COMMON SOURCE LINE ARRAY BIAS SCHEME

FIELD OF THE INVENTION

The present invention relates to Spin Torque Transfer (STT) Magnetoresistive Random Access Memory (MRAM), and more particularly, to improved STT MRAM common source line (CSL) array bias scheme.

BACKGROUND OF THE INVENTION

Spin Torque Transfer (STT) Magnetoresistive Random Access Memory (MRAM) is an attractive emerging memory technology, offering non-volatility, high performance, and high endurance. An STT MRAM memory cell generally includes a Magnetic Tunnel Junction (MTJ) in series with a Field Effect Transistor (FET) which is gated by a Word Line (WL). A Bit Line (BL) is connected to the MTJ and runs perpendicular to the WL. A Source Line (SL) is connected to the FET.

The SL can be wired within the array in a number of different configurations. One approach is to wire the SL parallel to and at the same pitch as the BL. Another approach is to connect the SL terminals of all cells within a group of BLs together, in what is known as a Common Source Line (CSL) configuration. The grouped BLs often correspond to the domain of a Write Driver circuit. This means that only one cell may be written at a time within that domain.

Advantageously, a CSL configuration can result in a smaller cell and lower SL resistance. However, the CSL configuration places limitations on the methods used to write the cell, as all cells within that region share the same SL.

Thus, improved CSL array biasing schemes would be desirable.

SUMMARY OF THE INVENTION

The present invention provides improved Spin Torque Transfer (STT) Magnetoresistive Random Access Memory (MRAM) common source line (CSL) array bias schemes. In one aspect of the invention, a method for operating a CSL STT MRAM array is provided. The method includes: providing the STT MRAM array having a plurality of word lines perpendicular to both a plurality of bit lines and at least one source line; a plurality of memory cells including magnetic tunnel junctions in series with field effect transistors, wherein the field effect transistors are gated by the word lines, wherein the bit lines are connected to the magnetic tunnel junctions, and wherein the source line is connected to the field effect transistors; and applying a first word line voltage (Vdd) to a selected one of the word lines during a read, and a different second word line voltage (Vpp) to the selected word line during a write.

In another aspect of the invention, another method for operating a CSL STT MRAM array is provided. The method includes: providing the STT MRAM array having a plurality of word lines perpendicular to both a plurality of bit lines and at least one source line; a plurality of memory cells having magnetic tunnel junctions in series with field effect transistors, wherein the field effect transistors are gated by the word lines, wherein the bit lines are connected to the magnetic tunnel junctions, and wherein the source line is connected to the field effect transistors; applying a first word line voltage (Vdd) to a selected one of the word lines during a read; applying a second word line voltage (Vpp) to the selected word line during a write, wherein the first word line voltage (Vdd) is less than the second word line voltage (Vpp); and writing a magnetic tunnel junction of a selected one of the memory cells to a logic 0 by driving i) a selected one of the bit lines to a write voltage Vwr0, and ii) the source line and unselected bit lines to a non-zero source line voltage Vsl0.

A more complete understanding of the present invention, as well as further features and advantages of the present invention, will be obtained by reference to the following detailed description and drawings.

BRIEF DESCRIPTION OF THE DRAWINGS

FIG. 1 is a diagram illustrating a basic Spin Torque Transfer (STT) Magnetoresistive Random Access Memory (MRAM) biasing scheme according to an embodiment of the present invention;

FIG. 2 is a diagram illustrating an exemplary improved STT MRAM common source line (CSL) biasing scheme according to an embodiment of the present invention;

DETAILED DESCRIPTION OF PREFERRED EMBODIMENTS

Figure 3:
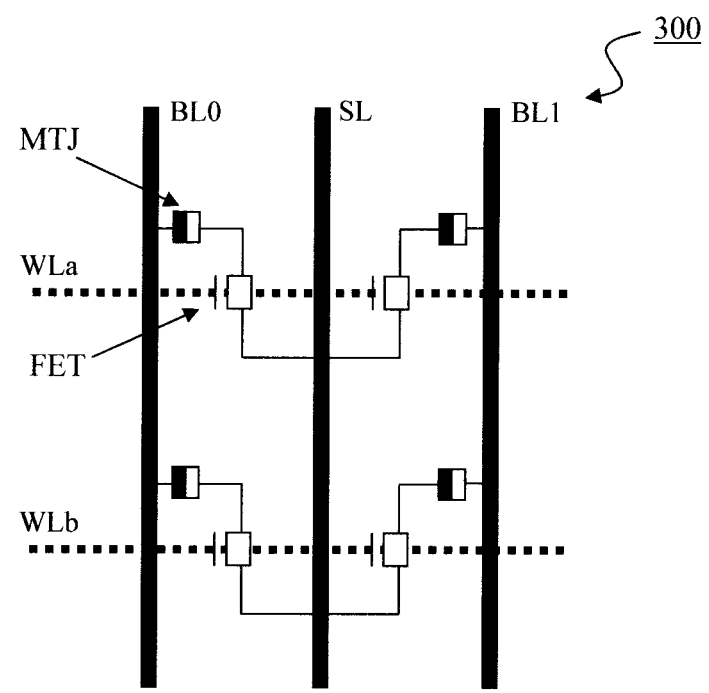
FIG. 3 is a schematic diagram of an STT MRAM array in which the present biasing techniques can be implemented according to an embodiment of the present invention.

Provided herein are techniques for biasing a Spin Torque Transfer (STT) Magnetoresistive Random Access Memory (MRAM) common source line (CSL) array with improved write current capability and standby power. As will be described in detail below, the present biasing techniques involve using a lower selected word line (WL) voltage for read (Vdd) than for Write (Vpp). Also, the source line (SL) and unselected bit lines (BL) should be driven to Vsl0 during a Write0 cycle. The abbreviation Vsl0 stands for Voltage Source Line when writing 0. Vsl0 can be an internally generated voltage level at about 0.2 volts (V) above ground.

As provided above, an STT MRAM memory cell generally includes a Magnetic Tunnel Junction (MTJ) in series with a Field Effect Transistor (FET) which is gated by a Word Line (WL). A Bit Line (BL) is connected to the MTJ and runs perpendicular to the WL. A Source Line (SL) is connected to the FET. An exemplary SL configuration that may be used in accordance with the present techniques is described, for example, in commonly owned U.S. patent application Ser. No. 15/251,564, entitled "Improved STT MRAM Source Line Configuration," by DeBrosse, the contents of which are incorporated by reference as if fully set forth herein.

Operation of an STT MRAM memory cell array generally proceeds as follows: in standby, the WL, BL, and SL are held to ground. One cell along the BL is selected by raising its WL. When a sufficiently large voltage is forced across the cell from BL to SL, the selected MTJ is written to a particular (i.e., parallel or anti-parallel) state representing a logic "1" or a logic "0," respectively. The written state is determined by the polarity of this voltage (BL high versus SL high). For read, the selected BL current is sensed while forcing the BL to Vread, perhaps 100 mV above the SL which is held to ground.

To understand the present scheme, it is useful to first look at a basic biasing scheme. See, for example, FIG. 1. Reference will be made herein to a CSL array configuration where the SL terminals of all cells within a group of m BLs are connected together, wherein m=4, 8, 16, 32, etc. Thus, using a simple example, if m=4 for example, then the SL terminals for all cells within the group of these 4 BLs are connected together. Further, when one of the BLs in the group of m BLs is selected, then m−1 BLs are the unselected BL.

Referring to FIG. 1, with a basic biasing scheme, in standby and unless mentioned, all array lines (WL, BL and SL) are held to 0 volts (V). For Read or Write, the selected WL is driven to Vpp (peak-to-peak voltage). Vpp is equivalent to the maximum Gate to Source voltage (Vgs_max). To write a 0, the selected BL is driven to Vwr0. To write a 1, the SL and the unselected m−1 BLs are driven to Vwr1. To read, a much smaller voltage Vread is applied to the selected BL and the resulting current is sensed. Vwr0 and Vwr1 are typically on the order of 0.8V, whereas Vread is typically less than 0.1V so as to avoid disturbing the state of the cell while reading.

As described above, the SL and unselected m−1 BLs are always driven to the same voltage so as to avoid any disturbing voltage on the half-selected m−1 cells corresponding to the selected WL and the unselected m−1 BLs. Since the SL and unselected BLs may have different slew rates at the start and at the end of the write pulse, it may be desirable to move the BLs and SL while the WL is low. In other words, the WL pulse should be "inside" the BL and SL pulses from a timing perspective.

The selected WL voltage Vpp is limited to Vgs_max, the maximum Gate to Source voltage reliably supported by the array FET technology. This is because the FETs of all cells in the array along the selected WL experience a SL voltage of 0 and hence a Vgs of Vpp except during a Write1 cycle. See rightmost column in FIG. 1.

When the cell is in the parallel or P state, the resistance of the MTJ is lower than when the cell is in the anti-parallel or AP state. Representative values might be $R_P$=10KΩ and $R_{AP}$=20KΩ. The state-dependent change in resistance is characterized by the parameter magnetoresistance or MR, which is defined as MR=($R_{AP}$−$R_P$)/$R_P$. For example, 100% is a typical nominal value for MR although higher values have been reported. P and AP may correspond to states 0 and 1, respectively, or vice versa, depending on the physical orientation of the MTJ (specifically whether the free layer is above or below the reference layer). Namely, current from the fixed to the free layer (up for free layer on top) writes a 1 or AP state and vice versa.

When reading, the data cell current can be compared to a reference current to determine the data state of the cell, i.e., 1 or 0. One method of generating this reference current is through the use of reference cells which have been pre-programmed to specific states and which are configured to produce a reference current roughly midway between the two nominal data state currents. This method provides excellent data to reference match many Process, Voltage, and Temperature (PVT) parameters. An exemplary reference cell layout that may be used in accordance with the present techniques is described, for example, in commonly owned U.S. patent application Ser. No. 15/251,466, entitled "STT MRAM Midpoint Reference Cell Allowing Full Write," by DeBrosse et al., the contents of which are incorporated by reference as if fully set forth herein.

Alternative STT MRAM array bias schemes have been described, for example, in DeBrosse et al., "A Fully-Functional 90 nm 8 Mb STT MRAM Demonstrator Featuring Trimmed, Reference Cell-Based Sensing," 2015 IEEE Custom Integrated Circuits Conference (CICC) (September 2015) (3 total pages) (hereinafter "DeBrosse"), and in U.S. Pat. No. 9,196,342 issued to Alam et al., entitled "Circuit and Method for Spin-Torque MRAM Bit Line and Source Line Voltage Regulation" (hereinafter "U.S. Pat. No. 9,196,342"), the contents of each of which are incorporated by reference as if fully set forth herein. While neither teaches a CSL array, DeBrosse and U.S. Pat. No. 9,196,342 describe STT MRAM array bias schemes employing an elevated (i.e., above 0V) BL and SL standby voltage (Vbleq and vbq, respectively) so as to allow a higher value of Vpp and therefore improve the write current capability of the cell. However, this elevated BL and SL standby voltage implies higher standby current, particularly in the event of BL or SL to WL shorting defects, since the unselected WLs are held at 0V.

Advantageously, the present STT MRAM CSL array biasing scheme permits the selected Write WL voltage (Vpp) to be greater than Vgs_max so as to improve the write current capability of the cell. However, all array lines (WL, BL, and SL) are held at 0V in standby, implying that the array component of standby current is exactly 0, even in the event of shorting defects.

The present STT MRAM CSL array biasing scheme is shown illustrated in FIG. 2. As shown in FIG. 2, in standby and unless mentioned, all array lines (WL, BL, and SL) are held to 0V. However, the selected WL is driven to Vdd (drain-drain voltage) for Read (as opposed to Vpp in the basic scheme) and Vpp for Write. To write a 0, the selected BL is driven to Vwr0, while the SL and unselected BLs are driven to Vsl0 (as opposed to 0V in the basic scheme). To write a 1, the SL and unselected m−1 BLs are driven to Vwr1. To read, Vread is applied to the selected BL and the resulting current is sensed.

This biasing scheme differs from the basic scheme in two respects. First, a lower selected WL voltage is used for Read (Vdd) than for Write (Vpp). Second, the SL and unselected m−1 BLs are driven to (non-zero SL voltage) Vsl0 during a Write0 cycle. Together, these changes allow Vpp to be greater than Vgs_max, thus improving the write current capability of the cell. Specifically, since the lowest array FET source voltage along the selected WL is Vsl0 in a Write 0 cycle, the W1L (Vpp) can go up to Vsl0+Vgs_max for Wr0. Since the lowest array FET source voltage along the selected WL is Vmtj_wr1 in a Write 1 cycle, the W1L (Vpp) can go up to Vsl0+Vgs_max for Wr1. Since Wr0 and Wr1 can occur concurrently along a WL, Vpp is limited to the minimum of these two values=min(Vsl0, Vmtj_wr1)+Vgs_max.

Specifically, all array lines are at 0V in standby, such that the array standby current and array FET gate oxide stress are exactly 0. By definition, Vdd is less than or equal to the Vgs_max of any particular FET technology, such that the Read array FET gate stress (Vgs=Vdd) is acceptable. Gate stress Vgs, also referred to herein as "gate-source voltage," corresponds to the voltage across the gate oxide. Gate oxide dielectric breakdown is the reliability issue being managed in accordance with the present techniques. The Write0 array FET gate stress (Vgs=Vpp−Vsl0) and Write1 array FET gate stress (Vgs=Vpp−Vmtj_wr1) are each less than Vpp, suggesting that Vpp can be raised to Vpp=min (Vsl0, Vmtj_wr1)+Vgs_max where Vmtj_wr1 is the voltage across the MTJ during Write1. Hence the Vpp may be raised by min (Vsl0, Vmtj_wr1) relative to the basic scheme, improving the write current capability of the cell. Exemplary values might be Vwr0=Vwr1=Vdd=0.8V, Vread=0.1V, Vsl0=0.2V, Vmtj_wr1=Vmtj_wr0=0.4V, and Vgs_max=1.0V. They apply to the selected WL, BL, SL, and FET/MTJ of the selected memory cell.

In this example:
Vpp=min (Vsl0, Vmtj_wr1)+Vgs_max1
Vpp=min (0.2V, 0.4V)+1.0V=1.2V
Vgs_wr0=Vpp−Vsl0
Vgs_wr0=1.2V−0.2V=1.0V
Vds_wr0=Vwr0−Vmtj_wr0−Vsl0
Vds_wr0=0.8V−0.4V−0.2V=0.2V
Vgs_wr1=Vpp−Vmtj_wr1
Vgs_wr1=1.2V−0.4V=0.8V
Vds_wr0=Vwr1−Vmtj_wr1
Vds_wr0=0.8V−0.4V=0.4V Further, if Vsl0<Vmtj_wr1 and Vwr0=Vwr1=Vdd as in the example,
Vgs_wr0=Vgs_max
Vds_wr0=Vdd−Vmtj_wr0−Vsl0
Vgs_wr1=Vgs_max+Vsl0−Vmtj_wr1
Vds_wr1=Vdd−Vmtj_wr1

From these equations it is clear that tuning Vsl0 provides a method for shifting write current margin from the Write 0 configuration to the Write 1 configuration while ensuring that the maximum total write margin is maintained. This is an extremely attractive feature of this bias scheme.

FIG. 3 is a schematic diagram 300 of an STT MRAM array in which the present biasing techniques can be implemented. For simplicity, two WLs, two BLs, and a single shared (CSL) SL are shown. However, in practice, this layout would be extended. As shown in FIG. 3, each STT MRAM memory cell generally includes an MTJ in series with a FET. Each FET is gated by a WL (i.e., WLa, WLb, etc.). The WLs run perpendicular to the BLs. The BLs are connected to the MTJs. A SL is connected to the FET. The SL runs perpendicular to the BL. During operation, selecting a given WL and a given BL will select the memory cell at the intersection between the selected WL and BL.

For instance, the above-described biasing techniques are now described in the context of schematic 300 by way of reference to FIGS. 4-7. Generally, as noted above, one cell along the BL is selected by raising its WL. When a sufficiently large voltage is forced across the cell from BL to SL, the MTJ of the selected cell is written to a particular (i.e., parallel or anti-parallel) state representing a logic "1" or a logic "0," respectively. For read, the Vread is applied to the selected BL and the resulting current is sensed.

Figure 4:
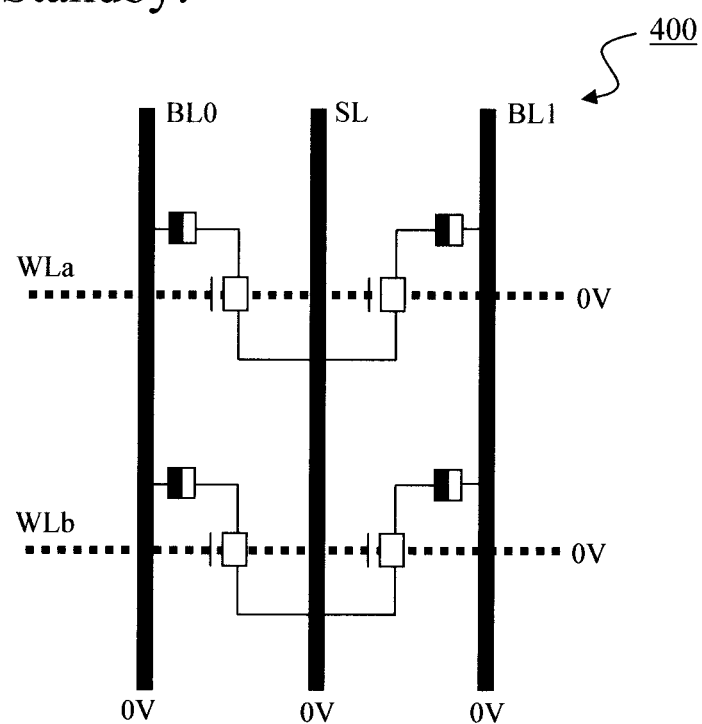
FIG. 4 is an example of the STT MRAM array in standby mode according to an embodiment of the present invention.
Figure 5:
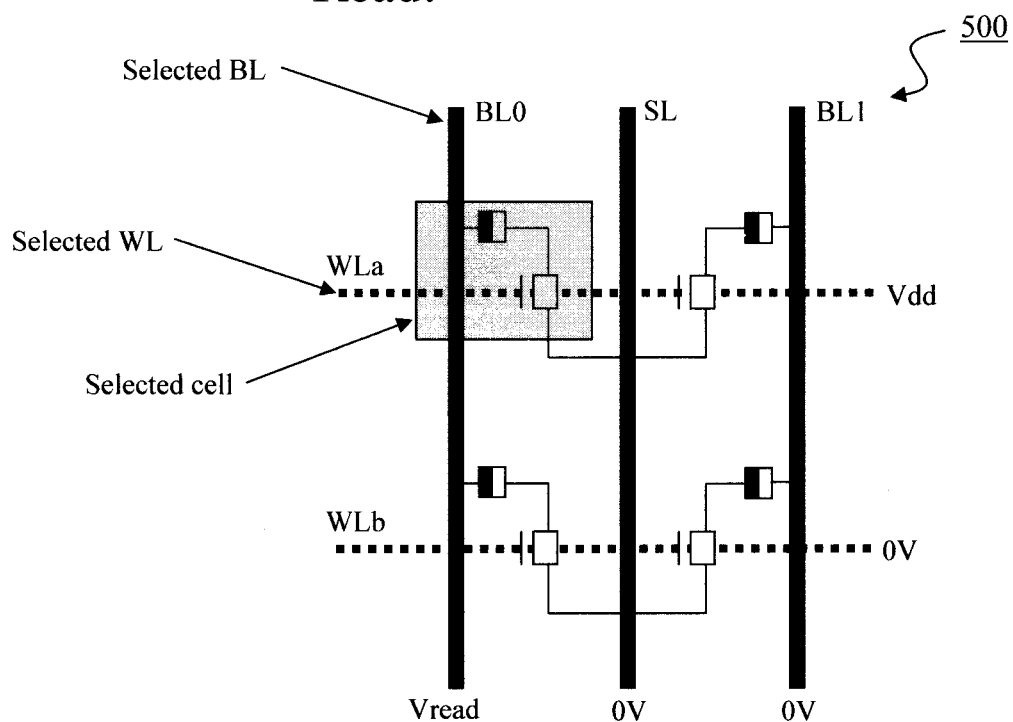
FIG. 5 is an example of the STT MRAM array during a read according to an embodiment of the present invention.
Figure 6:
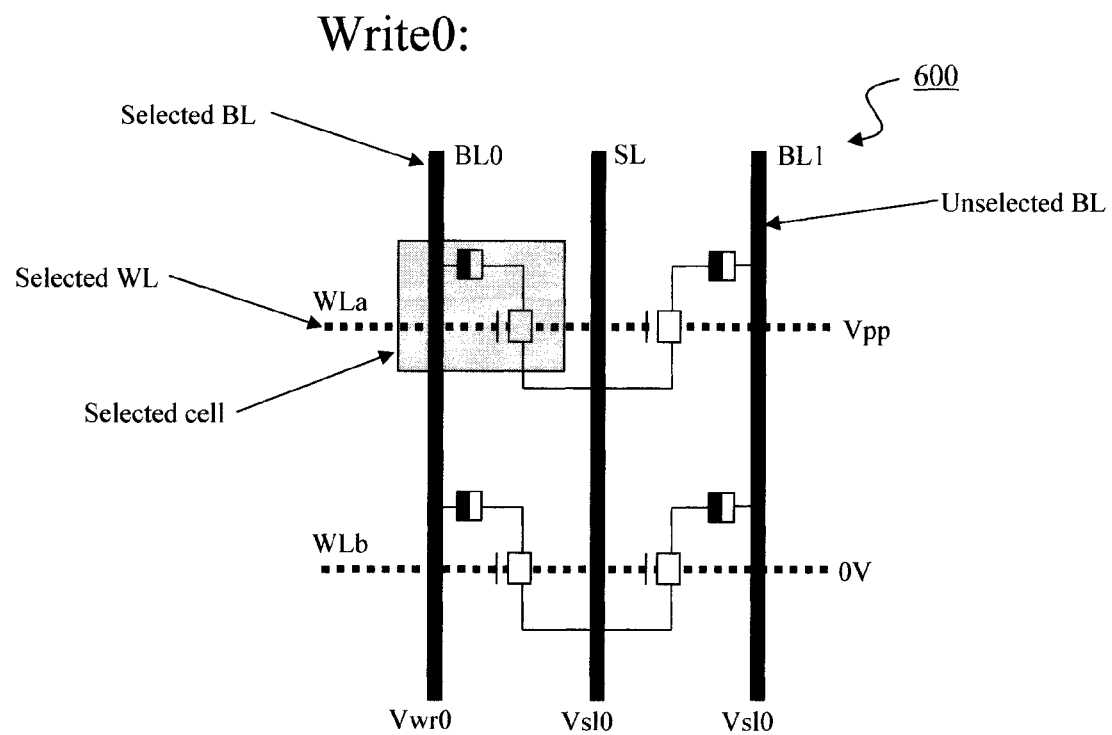
FIG. 6 is an example of the STT MRAM array during a Write0 according to an embodiment of the present invention.
Figure 7:
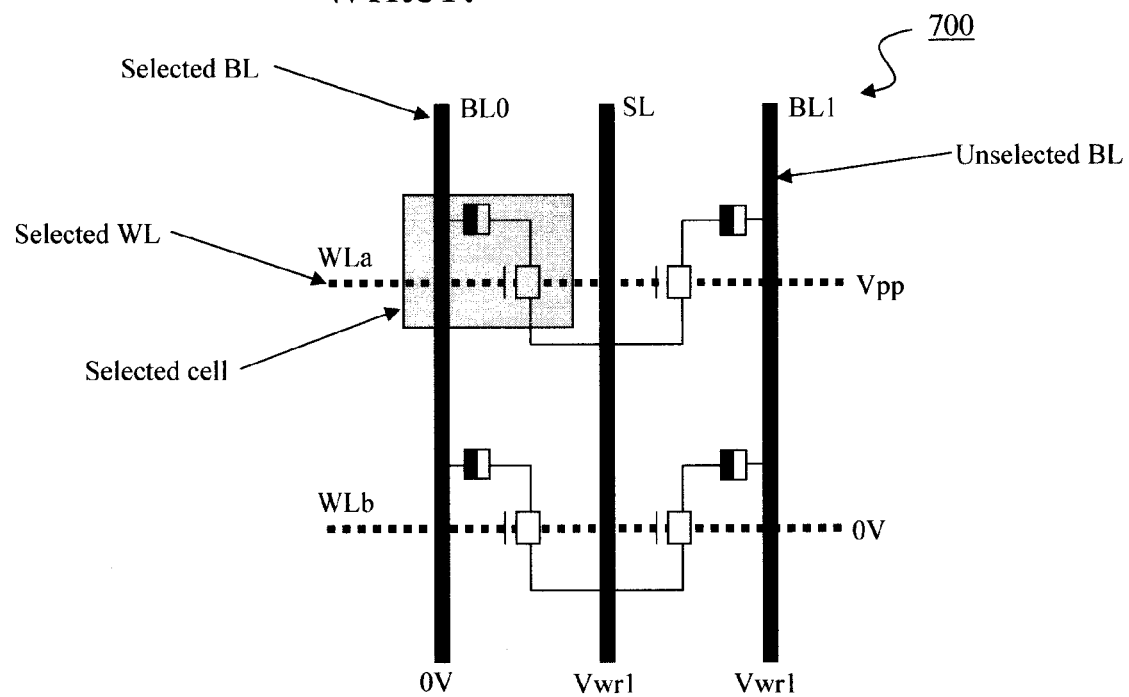
FIG. 7 is an example of the STT MRAM array during a Write1 according to an embodiment of the present invention.

As shown in schematic 400 of FIG. 4, in standby the WLs, BLs, and SLs are all held at 0 volts. As described above, this implies that the array component of standby current is exactly 0, even in the event of shorting defects.

During a read, the selected WL is driven to Vdd and the selected BL is driven to Vread. The selected memory cell is at the intersection of the selected WL and BL. See schematic 500 of FIG. 5. As described above, with the present biasing scheme a lower selected WL voltage is used for Read (Vdd) than for Write (Vpp), i.e., Vdd<Vpp, see below.

During a Write0, the selected WL is driven to Vpp (wherein Vpp>Vdd), the selected BL is driven to Vwr0, and the unselected BLs as well as the SL are driven to Vsl0. See schematic 600 of FIG. 6. As provided above, use of a non-zero Vsl0 for the unselected BLs and the SL, along with using a lower selected WL voltage for read, permits Vpp to be greater than Vgs_max.

During a Write1, the selected WL again is driven to Vpp, and the unselected BLs as well as the SL are driven to Vwr1. See schematic 700 of FIG. 7.

Figure 8:
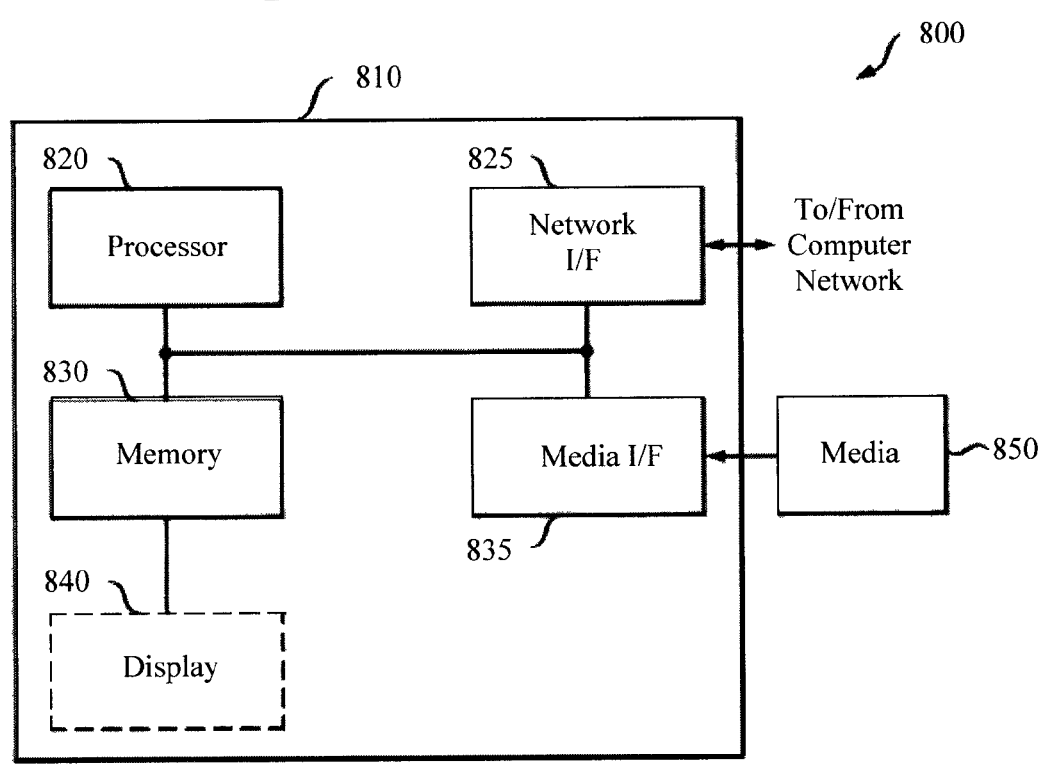
FIG. 8 is a diagram illustrating an exemplary apparatus for implementing the present techniques according to an embodiment of the present invention.

Turning now to FIG. 8, a block diagram is shown of an apparatus 800 for implementing one or more of the biasing schemes presented herein. Apparatus 800 includes a computer system 810 and removable media 850. Computer system 810 includes a processor device 820, a network interface 825, a memory 830, a media interface 835 and an optional display 840. Network interface 825 allows computer system 810 to connect to a network, while media interface 835 allows computer system 810 to interact with media, such as a hard drive or removable media 850.

Processor device 820 can be configured to implement the methods, steps, and functions disclosed herein. The memory 830 could be distributed or local and the processor device 820 could be distributed or singular. The memory 830 could be implemented as an electrical, magnetic or optical memory, or any combination of these or other types of storage devices. Moreover, the term "memory" should be construed broadly enough to encompass any information able to be read from, or written to, an address in the addressable space accessed by processor device 820. With this definition, information on a network, accessible through network interface 825, is still within memory 830 because the processor device 820 can retrieve the information from the network. It should be noted that each distributed processor that makes up processor device 820 generally contains its own addressable memory space. It should also be noted that some or all of computer system 810 can be incorporated into an application-specific or general-use integrated circuit.

Optional display 840 is any type of display suitable for interacting with a human user of apparatus 800. Generally, display 840 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for operating a common source line (CSL) Spin Torque Transfer (STT) Magnetoresistive Random Access Memory (MRAM) array, the method comprising:
   providing the STT MRAM array having a plurality of word lines perpendicular to both a plurality of bit lines and at least one source line; a plurality of memory cells comprising magnetic tunnel junctions in series with field effect transistors, wherein the field effect transistors are gated by the word lines, wherein the bit lines are connected to the magnetic tunnel junctions, and wherein the source line is connected to the field effect transistors;
   applying a first word line voltage (Vdd) to a selected one of the word lines during a read, and a different second word line voltage (Vpp) to the selected word line during a write; and
   writing a magnetic tunnel junction of a selected one of the memory cells to a logic 0 by driving i) a selected one of the bit lines to a write voltage Vwr0, and ii) the source line and unselected bit lines to a non-zero source line voltage Vsl0.

2. The method of claim 1, further comprising:
holding the word lines, the bit lines, and the source line at zero volts (V) in standby.

3. The method of claim 1, wherein the first word line voltage (Vdd) is less than the second word line voltage (Vpp).

4. The method of claim 1, further comprising:
forcing a selected one of the bit lines to Vread during the read.

5. The method of claim 1, wherein a gate-source voltage of the selected memory cell Vgs=Vpp−Vsl0.

6. The method of claim 1, wherein the STT MRAM array comprises m bit lines, and wherein the unselected bit lines comprise m−1 of the bit lines.

7. The method of claim 1, wherein Vwr0=Vdd.

8. The method of claim 1, further comprising:
writing a magnetic tunnel junction of a selected one of the memory cells to a logic 1 by driving the source line and unselected bit lines to a write voltage Vwr1.

9. The method of claim 8, wherein the STT MRAM array comprises m bit lines, and wherein the unselected bit lines comprise m−1 of the bit lines.

10. The method of claim 7, wherein Vwr1=Vdd.

11. The method of claim 1, wherein Vpp is greater than a maximum Gate to Source voltage Vgs_max of a selected one of the memory cells.

12. A method for operating a CSL STT MRAM array, the method comprising:
providing the STT MRAM array having a plurality of word lines perpendicular to both a plurality of bit lines and at least one source line; a plurality of memory cells comprising magnetic tunnel junctions in series with field effect transistors, wherein the field effect transistors are gated by the word lines, wherein the bit lines are connected to the magnetic tunnel junctions, and wherein the source line is connected to the field effect transistors;
applying a first word line voltage (Vdd) to a selected one of the word lines during a read;
applying and a second word line voltage (Vpp) to the selected word line during a write, wherein the first word line voltage (Vdd) is less than the second word line voltage (Vpp); and
writing a magnetic tunnel junction of a selected one of the memory cells to a logic 0 by driving i) a selected one of the bit lines to a write voltage Vwr0, and ii) the source line and unselected bit lines to a non-zero source line voltage Vsl0.

13. The method of claim 12, further comprising:
holding the word lines, the bit lines, and the source line at zero volts (V) in standby.

14. The method of claim 12, further comprising:
forcing a selected one of the bit lines to Vread during the read.

15. The method of claim 12, wherein a gate-source voltage of the selected memory cell Vgs=Vpp−Vsl0.

16. The method of claim 12, wherein the STT MRAM array comprises m bit lines, and wherein the unselected bit lines comprise m−1 of the bit lines.

17. The method of claim 12, wherein Vwr0=Vdd.

18. The method of claim 12, further comprising:
writing the magnetic tunnel junction of the selected memory cell to a logic 1 by driving the source line and unselected bit lines to a write voltage Vwr1.

19. The method of claim 18, wherein Vwr1=Vdd.

20. The method of claim 12, wherein Vpp is greater than a maximum Gate to Source voltage Vgs_max of the selected memory cell.

* * * * *